(12) United States Patent
Kim et al.

(10) Patent No.: US 12,251,731 B2
(45) Date of Patent: Mar. 18, 2025

(54) HAPTIC DEVICE AND HAPTIC MODULE

(71) Applicant: CK MATERIALS LAB CO., LTD., Ansan-si (KR)

(72) Inventors: Jeen Gi Kim, Seoul (KR); Hyeong Jun Kim, Seoul (KR); Cheol Sung Jeong, Seoul (KR); In Sik Jee, Seoul (KR)

(73) Assignee: CK MATERIALS LAB CO., LTD., Ansan-si (KR)

( * ) Notice: Subject to any disclaimer, the term of this patent is extended or adjusted under 35 U.S.C. 154(b) by 296 days.

(21) Appl. No.: 17/799,180

(22) PCT Filed: Jul. 14, 2021

(86) PCT No.: PCT/KR2021/009051
§ 371 (c)(1),
(2) Date: Aug. 11, 2022

(87) PCT Pub. No.: WO2022/097877
PCT Pub. Date: May 12, 2022

(65) Prior Publication Data
US 2023/0074323 A1    Mar. 9, 2023

(30) Foreign Application Priority Data

Nov. 9, 2020 (KR) .......................... 10-2020-0148602
Feb. 17, 2021 (KR) .......................... 10-2021-0021211
Jul. 1, 2021 (KR) .......................... 10-2021-0086323

(51) Int. Cl.
*G08B 6/00*    (2006.01)
*B06B 1/04*    (2006.01)
*B06B 1/20*    (2006.01)
*H02K 33/02*    (2006.01)

(52) U.S. Cl.
CPC ................ *B06B 1/20* (2013.01); *B06B 1/045* (2013.01); *G08B 6/00* (2013.01); *H02K 33/02* (2013.01)

(58) Field of Classification Search
CPC ........... B06B 1/045; G08B 6/00; H02K 33/02
See application file for complete search history.

(56) References Cited

U.S. PATENT DOCUMENTS

| 10,423,230 B2 | 9/2019 | Kim et al. |
| 2016/0239086 A1 | 8/2016 | Do et al. |
| 2016/0373654 A1 | 12/2016 | Kwon et al. |
| 2018/0151281 A1 | 5/2018 | Khoshkava et al. |

FOREIGN PATENT DOCUMENTS

| KR | 10-2013-0023853 A | 3/2013 |
| KR | 10-1250288 B1 | 4/2013 |
| KR | 10-2016-0037729 A | 4/2016 |
| KR | 10-2017-0071898 A | 6/2017 |
| KR | 10-1790895 B1 | 10/2017 |
| KR | 10-2018-0061010 A | 6/2018 |
| KR | 10-2102965 B1 | 4/2020 |

*Primary Examiner* — Ramon M Barrera
(74) *Attorney, Agent, or Firm* — Jae Youn Kim; NKL Law

(57) ABSTRACT

A haptic device includes: a housing; a magnetic field generation unit disposed in the housing; an elastic support unit connected to the housing; a vibration unit which is connected to the elastic support unit, and which includes an elastic material in which magnetic particles are dispersed in a matrix; and a control unit for transmitting a signal to the magnetic field generation unit.

14 Claims, 9 Drawing Sheets

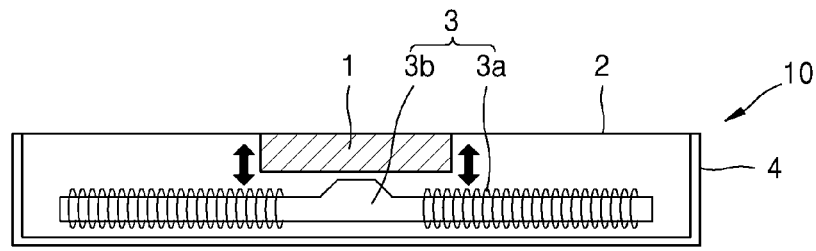
FIG. 4A
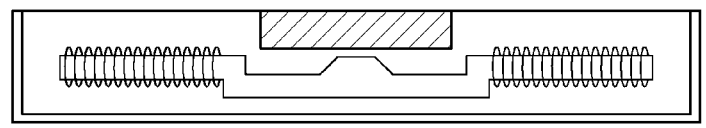
FIG. 4B
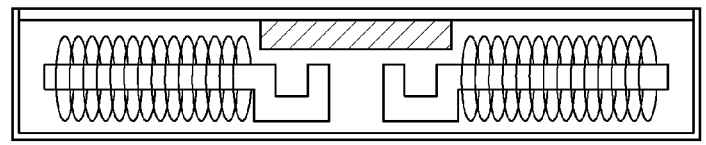
FIG. 4C
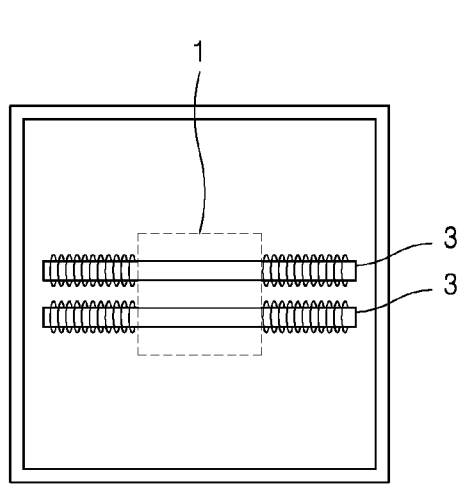 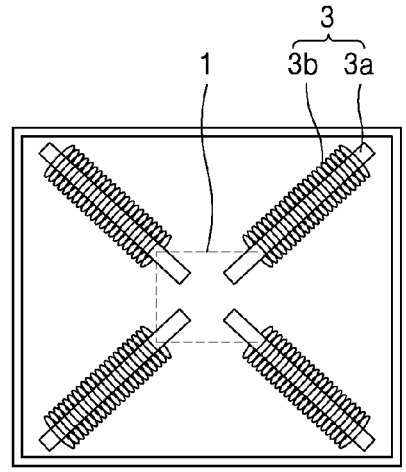
FIG. 4D            FIG. 4E

HAPTIC DEVICE AND HAPTIC MODULE

TECHNICAL FIELD

The present invention relates to a haptic device and a haptic module. More particularly, the present invention relates to a haptic device and a haptic module in which a vibration unit including a magnetorheological elastomer is coupled to an elastic support unit having elastic properties, thereby making it possible to implement various haptic patterns with less energy.

BACKGROUND ART

In general, a magnetorheological elastomer (MRE) actuator, an inertial actuator, a piezoelectric actuator, an electroactive polymer (EAP) actuator, an electrostatic actuator, etc. are used for the haptic technology. The MRE actuator is an element that comprises magnetic particles, a matrix material, and a magnetic field generation unit and provides various tactile sensations according to the intensity, direction or frequency of the magnetic field. Examples of the inertial actuator include an eccentric motor that vibrates by an eccentric force generated by the rotation of the motor, and a linear resonant actuator (LRA) that maximizes the vibrational intensity by resonant frequencies. The piezoelectric actuator is in the shape of a beam or a disk and is driven by a piezoelectric element whose size or shape changes instantaneously in response to an electric field. The EAP actuator generates vibration by repeated movements of a mass attached to an EAP film. The electrostatic actuator is driven by an attractive force generated between two oppositely charged glass sheets and a repulsive force generated when the glass sheets have charges with the same polarity. In addition, haptic devices using shape memory alloys, macrocomposite fiber, electrotactile sensations, electrostatic friction, ultrasonic waves, acoustic radiation pressure, and the like are being developed.

FIG. 1 illustrates a linear resonant actuator (LRA). A typical LRA includes a magnet, a coil, a suspension, and other structures.

In addition, in the MRE actuator, the shape of a magnetorheological elastomer changes in response to an attractive or repulsive force, as the N and S poles of a magnetic field produced in the solenoid coil alternate with each other according to the frequency of a voltage or current applied to the coil, and accordingly, a haptic effect is achieved.

DETAILED DESCRIPTION OF INVENTION

Technical Problem

An objective of the present invention is to provide a haptic device and a haptic module which can be formed in various shapes by applying thereto a magnetorheological elastomer and can provide various haptic sensations with an adjustable driving force.

Another objective of the present invention is to provide a haptic device and a haptic module which can be configured to be thin by lowering the height and can be driven with less energy.

Another objective of the present invention is to provide a haptic module capable of providing a local haptic sensation by applying a dual injection structure to an exterior thereof.

However, these objectives are exemplary, and the scope of the present invention is not limited thereto.

Solution to Problem

The above objective of the present invention is achieved by a haptic device including: a housing; a magnetic field generation unit disposed in the housing; an elastic support unit connected to the housing; a vibration unit which is connected to the elastic support unit, and which includes an elastic material in which magnetic particles are dispersed in a matrix; and a control unit for transmitting a signal to the magnetic field generation unit.

In addition, according to an embodiment of the present invention, a tactile sensation may be provided by the sum of an elastic motion of the elastic support unit and a deformation motion of the vibration unit in response to application of a magnetic field.

In addition, according to an embodiment of the present invention, the housing may have a shape in which an upper surface is open, and the elastic support unit may be connected to an edge of the open upper surface.

In addition, according to an embodiment of the present invention, the magnetic field generation unit may include a solenoid coil.

In addition, according to an embodiment of the present invention, the vibration unit may be disposed on an end of the coil of the magnetic field generation unit.

In addition, according to an embodiment of the present invention, the elastic support unit may include an edge portion connected to the housing; a driving portion connected to the vibration unit and driven in a vertical direction; and at least one connecting portion connecting the edge portion to the driving portion.

In addition, according to an embodiment of the present invention, the connecting portion may be formed longer than a rectilinear distance from the edge portion to the driving portion.

Also, according to an embodiment of the present invention, the connecting portion may have a curved shape or a shape having a plurality of curvatures.

In addition, according to an embodiment of the present invention, the control unit may include a terminal portion protruding to an outside of the housing, and may have a flexible printed circuit board (FPCB) formed on the terminal portion, the FPCB being connected to the magnetic field generation unit.

Further, according to an embodiment of the present invention, the vibration unit may be divided into regions each of which has a different polarity.

The above objective of the present invention is also achieved by a haptic module including: a haptic device configured to implement a haptic sensation; a fixing unit having an insertion hole into which the haptic device is inserted; and a tactile transmission unit connected to the fixing unit and configured to receive the haptic sensation generated by the haptic device, wherein the haptic device includes a housing; a magnetic field generation unit disposed in the housing; an elastic support unit connected to the housing; a vibration unit which is connected to the elastic support unit, and which includes an elastic material in which magnetic particles are dispersed in a matrix; and a control unit for transmitting a signal to the magnetic field generation unit.

In addition, according to an embodiment of the present invention, the tactile transmission unit may be made of at least one of thermoplastic polyurethane (TPU) or thermoplastic elastomer (TPE).

In addition, according to an embodiment of the present invention, the fixing unit may be made of a material different from that of the tactile transmission unit.

In addition, according to an embodiment of the present invention, the haptic module may further include a cover unit connected to the tactile transmission unit.

Also, according to an embodiment of the present invention, a plurality of insertion holes may be formed in the fixing unit, and a plurality of haptic devices may be inserted into the insertion holes, respectively.

Advantageous Effects

According to the present invention configured as described above, the shape can be varied by applying a magnetorheological elastomer (MRE) and various haptic sensations can be provided through a controllable driving force.

In addition, according to the present invention, a thin configuration may be achieved by lowering the height, and driving is possible with less energy.

Further, according to the present invention, a dual-injection structure is applied to an exterior, thereby allowing a local haptic sensation to be provided.

However, the scope of the present invention is not limited to the above-described effects.

BRIEF DESCRIPTION OF DRAWINGS

FIGS. 4A-4E illustrate schematic side cross-sectional views and schematic plan views showing a magnetic generation unit according to various embodiments of the present invention.

REFERENCE NUMERALS

Figure 1:
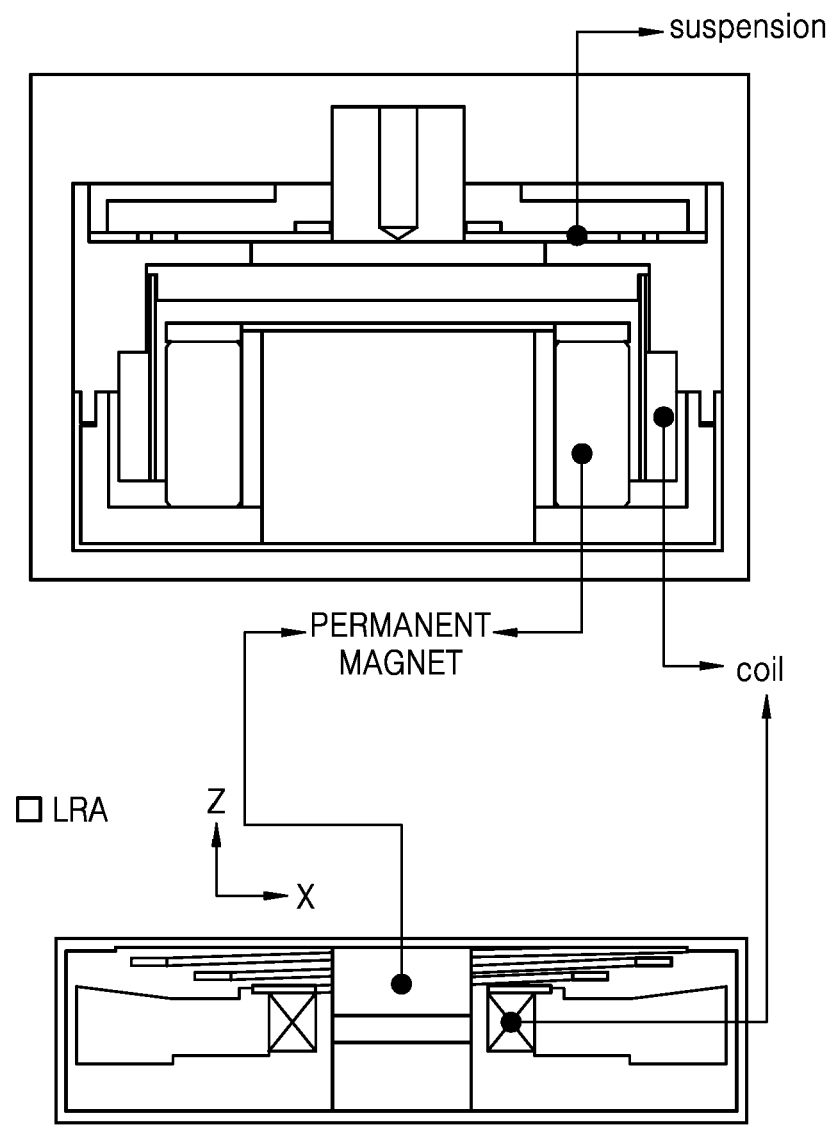
FIG. 1 is a schematic diagram of a linear resonant actuator (LRA).

1: VIBRATION UNIT
2: ELASTIC SUPPORT UNIT
3: MAGNETIC FIELD GENERATION UNIT
4: HOUSING
5: CONTROL UNIT
6: CIRCUIT
10: HAPTIC DEVICE
21: FIXING UNIT
24: TACTILE TRANSMISSION UNIT
100: HAPTIC MODULE

BEST MODE FOR INVENTION

Reference is made to the accompanying drawings that show, by way of illustration, more detailed example embodiments in which the invention may be practiced. These preferred embodiments are described in sufficient detail to enable those skilled in the art to practice the invention. It is to be appreciated that the various embodiments of the present invention, although different, are not necessarily mutually exclusive. For example, a particular feature, structure, or characteristic described herein in connection with one embodiment may be implemented within other embodiments without departing from the spirit and scope of the present invention. In addition, it is to be appreciated that the position or arrangement of individual elements within each disclosed embodiment may be modified without departing from the spirit and scope of the present invention. The following detailed description is, therefore, not to be taken in a limiting sense, and the scope of the present invention is defined only by the appended claims, if appropriately interpreted, along with the full range of equivalents to which the claims are entitled. In the drawings, like reference numerals denote like elements and lengths, areas, thicknesses or shapes may be exaggerated for the sake of convenience.

The following description is given of embodiments of the present invention with reference to the attached drawings in such a manner that the present invention can be easily carried out by one of ordinary skill in the art.

Figure 2A:
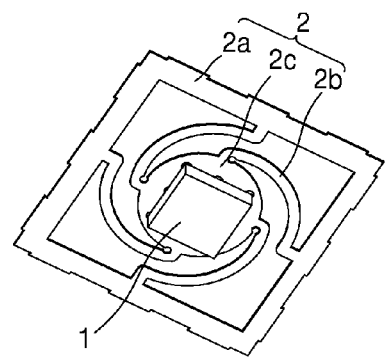
FIGS. 2A-2C schematically illustrate a configuration of a haptic device according to an embodiment of the present invention.
Figure 2B:
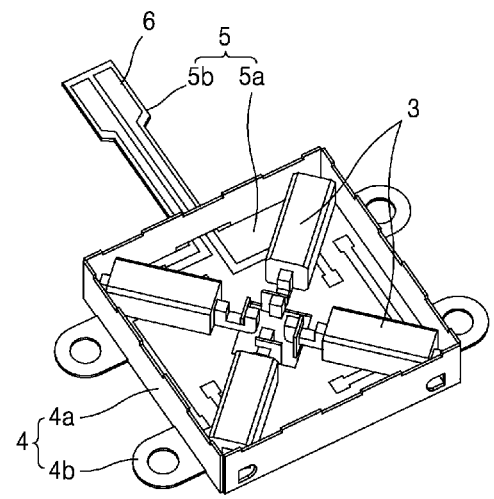
Figure 2C:
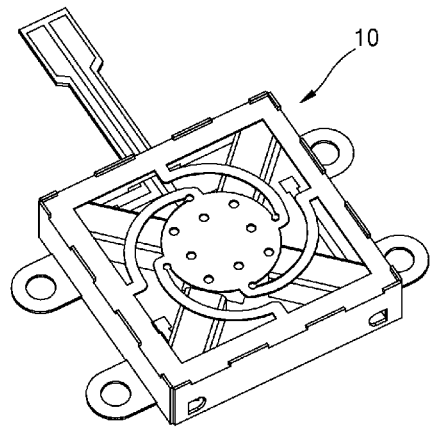
Figure 3A:
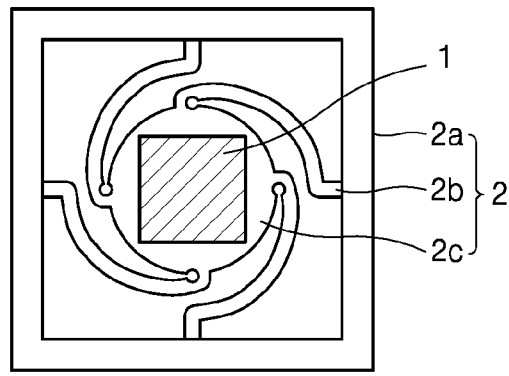
FIGS. 3A-3C illustrate schematic plan views showing an elastic support unit according to various embodiments of the present invention.
Figure 3B:
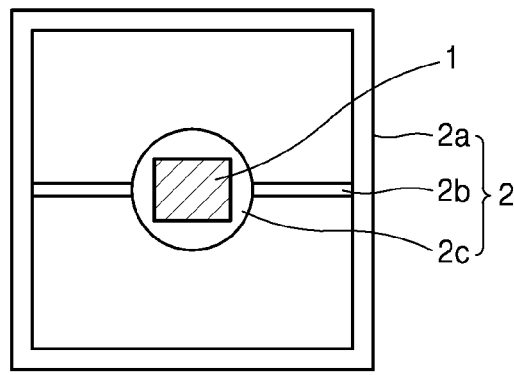
Figure 3C:
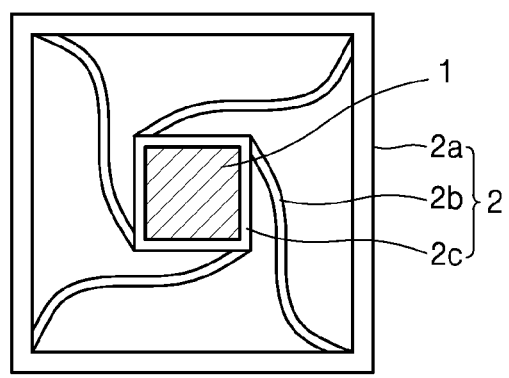

FIGS. 2A-2C schematically illustrate a configuration of a haptic device 10 according to an embodiment of the present invention. FIGS. 3A-3C illustrate schematic plan views showing an elastic support unit 2 according to various embodiments of the present invention. FIGS. 4A-4E illustrate schematic side cross-sectional views and schematic plan views showing a magnetic generation unit 3 according to various embodiments of the present invention.

The haptic device 10 (or magnetorheological elastomer (MRE) haptic device 10) of the present invention implements haptics by using the spring tension of the vibration unit 1 and the elastic support unit 2. The vibration unit 1 may be vertically driven by attractive and repulsive forces created by a magnetic field applied from the magnetic field generation unit 3, according to the magnetic polarity.

Referring to FIG. 2A, the vibration unit 1 may be connected to the elastic support unit 2.

The vibration unit 1 (or an MRE vibration unit 1) may include a magnetorheological elastomer, which is an elastic material in which magnetic particles are dispersed in a matrix, or may be configured itself as a magnetorheological elastomer. The vibration unit 1 may preferably have a thin and flat shape such that the haptic device 10 can be configured to be thin, but the vibration unit 1 may be modified in order to diversify haptic patterns.

The elastic support unit 2 may include an edge portion 2a, connecting portions 2b, and a driving portion 2c. The edge portion 2a, the connection portion 2b, and the driving portion 2c may be integrated with one another, or may be separate elements and connected to one another.

The edge portion 2a constitutes an outer edge frame of the elastic support unit 2, and may be supported on or inserted into a sidewall of the housing 4.

The connecting portion 2b may connect the edge portion 2a and the driving portion 2c. Although four connecting portions 2b are illustrated in FIG. 2A, there may be one or more connecting portions 2b may be provided as long as the connecting portion 2b connects the edge portion 2a and the driving portion 2c.

The connecting portion 2b may be spring-elastic so that the driving portion 2c can be supported by the edge portion 2a and can move up and down. To this end, the connecting portion 2b may be preferably formed longer than a rectilinear distance from the edge portion 2a to the driving portion 2c. If the length of the connecting portion 2b is the same as the rectilinear distance from the edge portion 2a to the driving portion 2c, the driving unit 2c may be difficult to move up and down. The connecting portion 2b may preferably have a curved shape or a shape having a plurality of curvatures.

Referring to FIG. 3A, it is illustrated that four connecting portions 2b extend in a curved shape from the center of each side of the edge portion 2a and are connected to the circular driving portion 2c.

Referring to FIG. 3B, it is illustrated that two connecting portions 2b extend from the center of each side of the edge portion 2a and are connected to the driving portion 2c. However, in this case, the connecting portions 2b are formed of a stretchable material so that it may be stretched to be longer than the rectilinear distance from the edge portion 2a to the driving portion 2c.

Referring to FIG. 3C, it is illustrated that four connecting portions 2b extend in a shape having a plurality of curvatures from four corners of the edge portion 2a and are respectively connected to four corners of the square-shaped driving portion 2c.

The driving portion 2c may be connected to the vibration unit 1 and may be driven in a vertical direction. When the vibration unit 1 is vertically driven by the magnetic field applied from the magnetic field generation unit 3, the driving portion 2c connected to the vibration unit 1 may also be vertically driven. The driving portion 2c may be preferably formed to have a larger area than the area of the vibration unit 1.

In addition, the elastic support unit 2 is not limited to the shapes and materials of FIGS. 2 and 3 as long as it vertically drives the vibration unit 1 with its spring tension.

Referring to FIG. 2B, the magnetic generation unit 3 may be disposed inside the housing 4. The magnetic field generation unit 3 may use a means capable of controlling a direction of a magnetic field. Preferably, the magnetic field generation unit 3 may include a solenoid coil to control the direction of a flowing current, thereby changing the direction of a magnetic field. The magnetic field generation unit 3 may be disposed along a horizontal direction within the housing 4, and may be disposed to apply a magnetic field from a lower portion of the vibration unit 1 disposed at the central portion to an upper portion. In consideration of this, it is preferable that the vibration unit 1 is disposed above from an end of the solenoid coil.

Referring to FIG. 4A, it is illustrated that coils 3a are wound round a rod 3b. A magnetic field is applied from an end of each coil to the vibration unit 1 disposed above from the coil so that the vibration unit 1 can move up and down. In addition to this, since the vibration unit 1 is connected to the elastic support unit 2, even if energy less than the energy required for the vibration unit 1 to perform up-and-down motion is applied, the momentum may be further increased by the spring elasticity of the elastic support unit 2.

Referring to FIGS. 4B and 4C, a shape in which a magnetic field is applied may be changed according to a pattern shape of the rod 3b. Referring to FIGS. 4D and 4E, the magnetic field generation units 3 may be disposed in parallel or diagonally to each other. The arrangement and number of the magnetic field generation units 3 may vary without limitation as long as the magnetic generation units 3 can transmit a resultant magnetic field to the vibration unit 1 at the center above them and vertically drive the vibration unit 1.

Meanwhile, the magnetic field generation unit 3 may be configured only with the coil 3a while omitting the rod 3b. The coil 3a may be provided in singular or plural quantities, and the coils 3a may be configured to stand upright or to be laid flat.

The housing 4 may have a shape in which at least one surface (e.g., a top surface) is open. The housing 4 may include sidewalls 4a and groove portions 4b horizontally protruding from the sidewalls 4a. The inside of the housing 4 surrounded by the sidewalls 4a may provide a space in which the vibration unit 1 moves and a space in which the magnetic field generation unit 3 is disposed.

The edge portion 2a of the elastic support unit 2 may be disposed on the open surface of the housing 4, i.e., upper portions of the sidewalls 4a. Lower portions of the sidewalls 4a of the housing 4 may be open, or may have a lower surface integrally formed with the sidewalls 4a. When the lower portions of the sidewalls 4a are open, a control unit body 5a may be disposed in the lower portions of the sidewalls 4a.

The control unit 5 may include the control unit body 5a and a terminal portion 5b. The control unit body 5a may constitute a lower surface of the housing 4, and a portion extending from the control unit body 5a to the outside of the housing 4 may constitute the terminal portion 5b.

The circuit 6 may be formed on the control unit 5 so that an electrical/magnetic energy signal may be transmitted from an external signal input means (not shown) to the magnetic field generation unit 3. The circuit 6 may be formed from the terminal portion 5b to the magnetic field generation unit 3 on the control body 5a. The circuit 6 may be preferably a flexible printed circuit board (FPCB) such that the control unit 5 can be configured to be thin.

Referring to FIG. 2C, the haptic device 10 produced by connecting thereto a coupled structure of the vibration unit 1 and the elastic support unit 2 in a state in which the control unit 5 is connected to the lower surface of the housing 4 and the magnetic field generation unit 3 is disposed inside the housing 4 is shown.

The haptic device 10 of the present invention can be driven by the spring tension of the elastic support unit 2 and attractive and repulsive forces of MRE magnetic polarities of the vibration unit 1, and thus can be driven with a small magnetic field. Therefore, it is possible to overcome problems of a conventional MRE actuator that requires a large amount of magnetic field to realize a desired force and generates severe heat. In addition, since the MRE of the vibration unit 1 is also driven while generating microdeformation in response to the magnetic field, vibration is realized by the sum of the elastic motion of the elastic support unit 2 and the deformation motion of the MRE in response to the application of the magnetic field. Thus, it is possible to generate not a simple vibration but a vibration having a haptic pattern. In addition, as the MRE is used, a much thinner haptic module may be implemented as compared to the conventional LRA shown in FIG. 1, and may be drive with less energy.

Figure 5A:
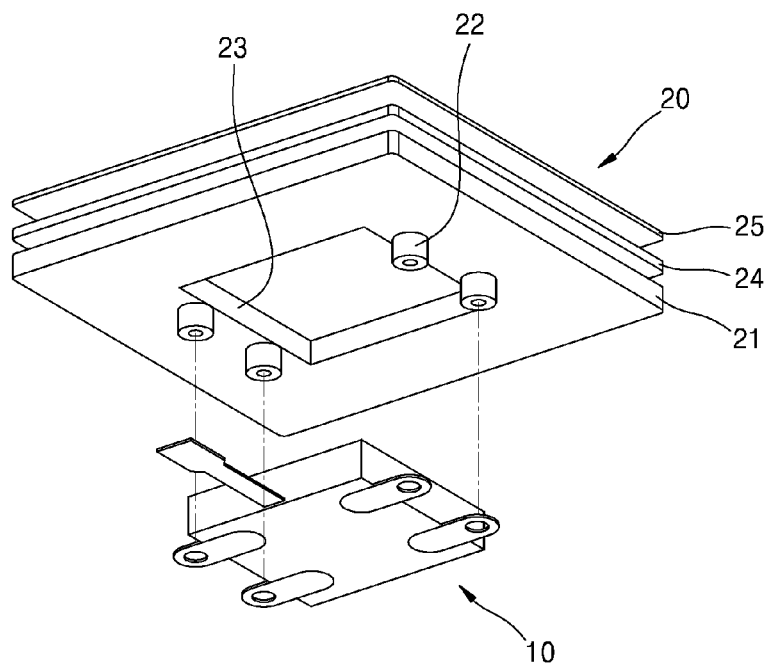
FIGS. 5A-5B illustrate schematic bottom perspective views of a haptic module according to an embodiment of the present invention.
Figure 5B:
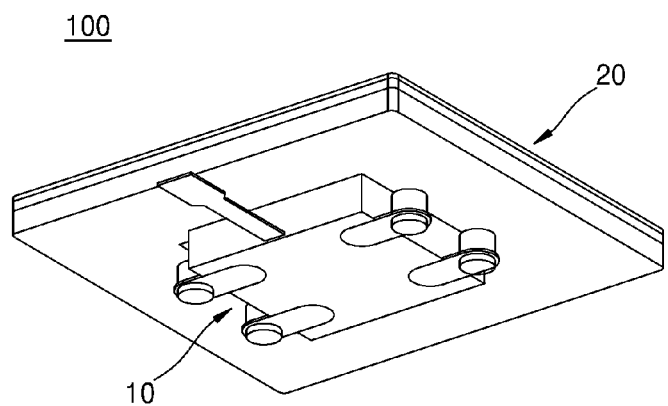
Figure 6A:
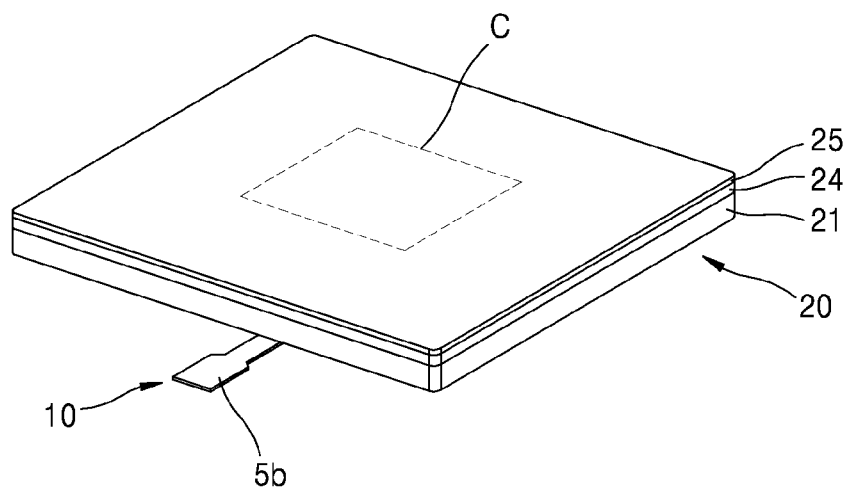
FIGS. 6A-6B illustrate a schematic perspective view and a schematic side cross-sectional view of a haptic module according to an embodiment of the present invention.
Figure 6B:
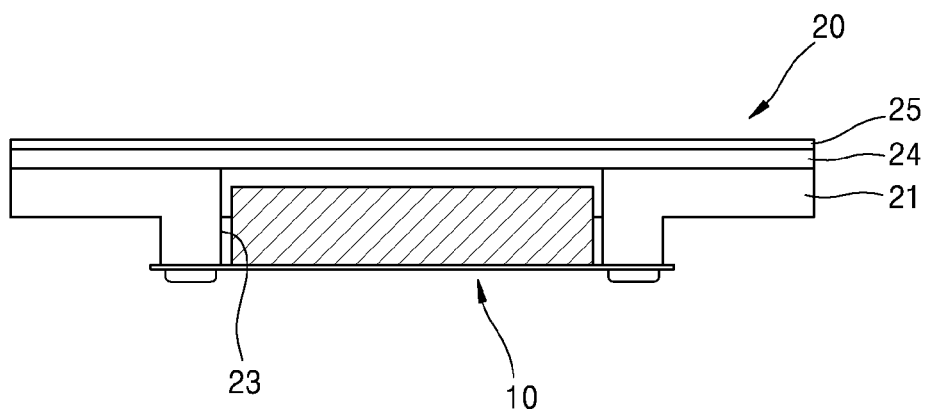

FIGS. 5A-5B illustrate schematic bottom perspective views of a haptic module 100 according to an embodiment of the present invention. FIGS. 6A-6B illustrate a schematic perspective view and a schematic side cross-sectional view of the haptic module 100 according to an embodiment of the present invention.

Referring to FIGS. 5A-5B and 6A-6B, the haptic module 100 (or a magnetorheological elastomer haptic module 100) includes a haptic device 10, a fixing unit 21, a tactile transmission unit 24, and may further include a cover unit 25.

An insertion hole 23 into which the haptic device 10 is inserted may be formed in the fixing unit 21. The insertion hole 23 may preferably have a shape corresponding to the haptic device 10, but is not limited to a particular shape as long as it has a shape into which the haptic device 10 is inserted. After the haptic device 10 is inserted into the insertion hole 23, a groove portion 4b of the haptic device 10 and a groove portion 22 of the fixing unit 21 may be connected with a screw or the like to fix the haptic device 10. An upper surface of the haptic device 10 may penetrate through the insertion hole 23 and be positioned at an upper height of the fixing unit 21.

The tactile transmission unit 24 may be connected onto the fixing unit 21. The tactile transmission unit 24 may cover the entire upper surface of the fixing unit 21 without holes formed thereon. The upper surface of the haptic device 10 may penetrate through the insertion hole 23 and may be in contact with a lower surface of the tactile transmission unit 24. Although FIGS. 5A-5B illustrate that one insertion hole 23 is formed in the fixing unit 21, a plurality of insertion holes 23 may be formed and a plurality of haptic devices 10 may be inserted into the plurality of insertion holes 23. In addition, a plurality of insertion holes 23 respectively having different sizes and shapes, and the haptic device 10 corresponding to the shape of each insertion hole 23 may be inserted into the insertion hole 23, thereby providing various haptic sensations according to a region of the tactile transmission unit 24.

The fixing unit 21 may be made of a hard material, and the tactile transmission unit 24 may be made of a soft material. Accordingly, the haptic device 10 is firmly fixed to the fixing unit 21, which is a hard material, and a haptic sensation may be provided from the center C (see FIG. 6A) of the tactile transmission unit 24, which is a soft material, via the up-and-down motion of the vibration unit 1 and the elastic support unit 2. For example, the fixing unit 21 formed of a hard material such as polycarbonate (PC) and the tactile transmission unit 24 formed of a soft material such as thermoplastic polyurethane (TPU), thermoplastic elastomer (TPE), or the like may be formed in a dual injection structure.

Since the fixing unit 21 has a hollow central portion due to the insertion hole 23, a vibration force may be insignificant in the portion surrounded by the fixing unit, and a local vibration force may be generated in the central portion due to the haptic device 10 inside the insertion hole 23. The local vibration force may be transmitted to an upper portion through the tactile transmission unit 24, which is a soft material.

The cover unit 25 may be further formed on the tactile transmission unit 24. The cover unit 25 may include glass or the like and receive a tactile sensation from the tactile transmission unit 24. However, while omitting the cover unit 25, a target object (e.g., glass, a display, and so on) to which the haptic module 100 is to be applied may act as the cover unit 25. As the haptic module 100 is attached to the target object, the haptic sensation can be transmitted to the target object and various applications requiring local haptic sensations may be possible.

Conventional haptic motors are composed of permanent magnets, coils, and accessories for attaching them and thus have a structural limitation for lowering the height thereof. Also, the conventional haptic motors are difficult to apply to products that require a local vibration force since a vibration force is transmitted to the entire structure which surrounds the motor or is in proximity to the motor. On the other hand, the present invention includes the MRE and thus can be applied to surfaces of various devices by changing the shape of an MRE material, and furthermore, can provide a local haptic sensation.

Figure 7A:
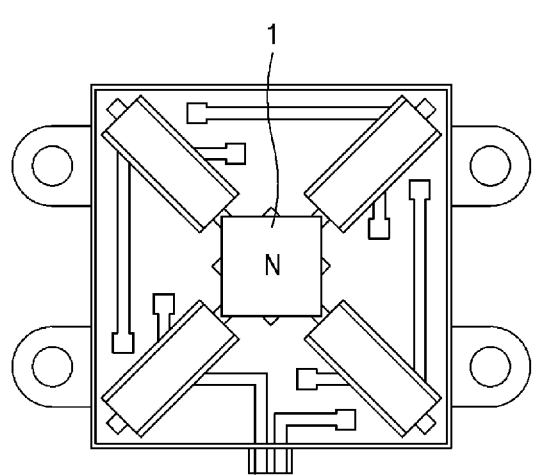
FIGS. 7A-7B illustrate schematic plan views and schematic side cross-sectional views showing realization of a local haptic sensation by a haptic module according to an embodiment of the present invention.
Figure 7A:
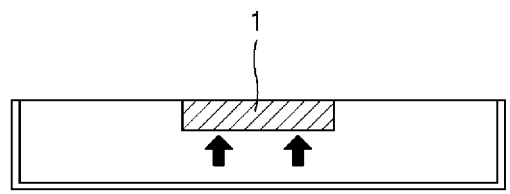
Figure 7B:
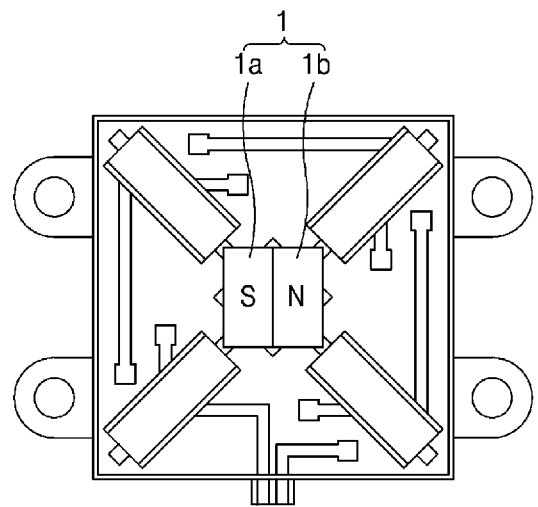
Figure 7B:
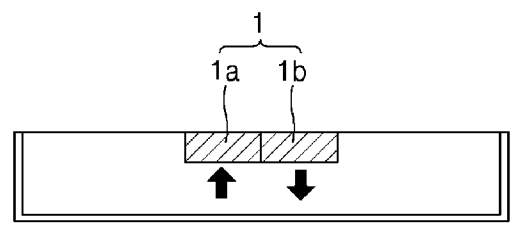

FIGS. 7A-7B illustrate schematic plan views and schematic side cross-sectional views showing realization of a local haptic sensation by a haptic module according to an embodiment of the present invention.

According to the present invention, the vibration unit 1 can be changed to various shapes and the polarity of the magnetic field of the magnetic field generation unit 3 can be changed in various ways, so that not only a simple up-and-down motion but also a zigzag up-and-down motion or the like is possible, thereby providing a variety of tactile sensations.

For example, referring to FIGS. 7A and 7B, polarity separation on the surface of the vibration unit 1 may be performed in various ways to match with the polarity of the magnetic field of the magnetic field generation unit 3. FIG. 7A illustrates that the vibration unit 1 has one polarity and is able to move up and down in response to the application of a magnetic field. FIG. 7B illustrates that the vibration unit 1 is divided into a plurality of regions 1a and 1b each of which has a different polarity, so that even when the same magnetic field is applied, region 1a moves upward while region 1b moves downward, thus causing the vibration unit 1 to be twisted or to move up and down in a zigzag pattern. Therefore, various tactile sensations can be provided to the central portion C of the tactile transmission unit 24. Accordingly, various driving sources may be provided, thereby achieving a variety of driving patterns.

Figure 8:
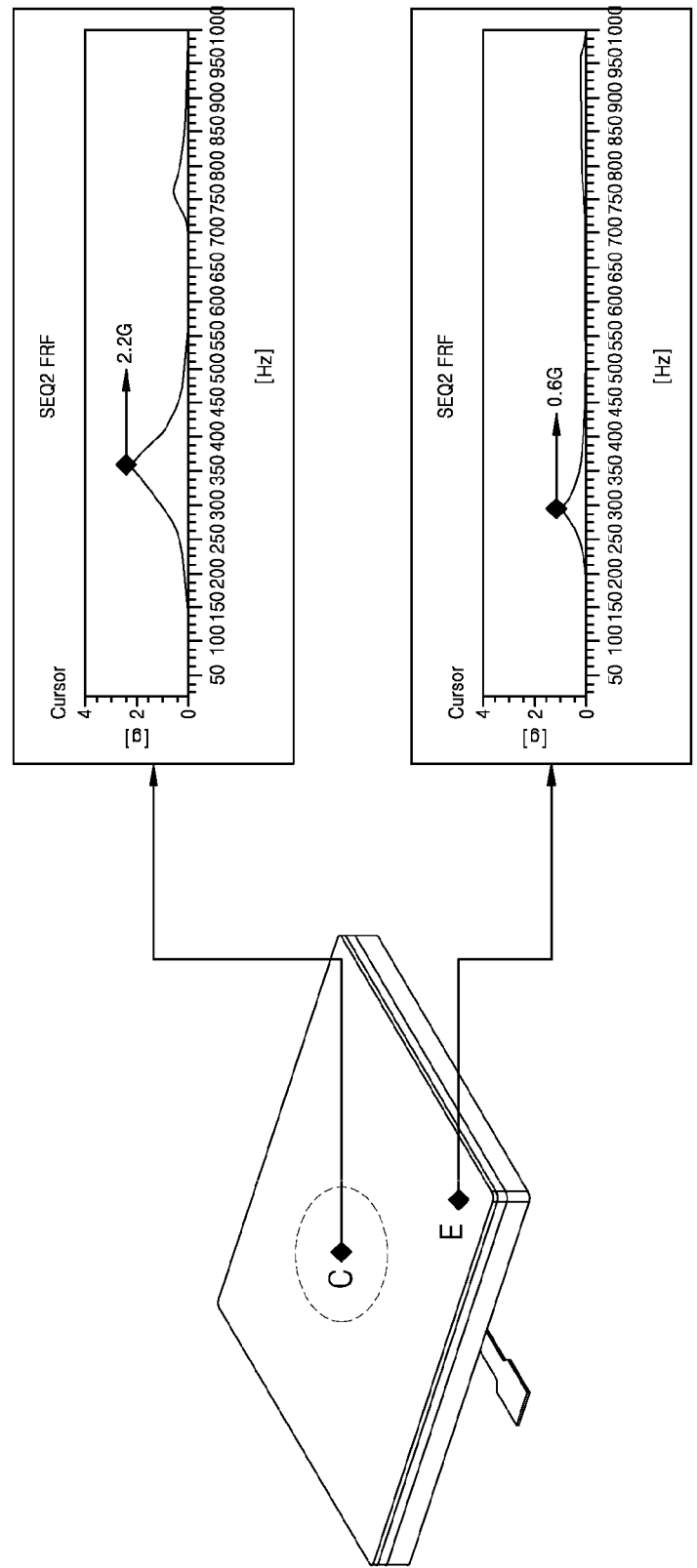
FIG. 8 illustrates a local haptic sensation intensity of a haptic module according to an experimental example of the present invention.

FIG. 8 illustrates a local haptic sensation intensity of a haptic module according to an experimental example of the present invention.

As described above with reference to FIGS. 5A-5B and 6A-6B, dual injection is applied to the structure of the fixing unit 21 and the tactile transmission unit 24 (e.g., a PC fixing unit 21 and a TPE tactile transmission unit 24) so that a haptic sensation can be maximized when the haptic device 10 is in proximity contact with a soft material such as the TPE tactile transmission unit 24.

Referring to the upper graph of FIG. 8, it can be seen that the central portion C of the tactile transmission unit 24 receives a vibration directly from the MRE of the haptic device 10 and has a high tactile intensity. Referring to the lower graph of FIG. 8, it can be seen that an edge portion E of the tactile transmission unit 242 directly connected to the fixing unit 21 has a low tactile intensity due to the PC fixing unit 21, which is a hard material. Accordingly, various tactile sensations may be provided at various intensities according to the shape of the insertion hole 23 of the fixing unit 21.

Figure 9A:
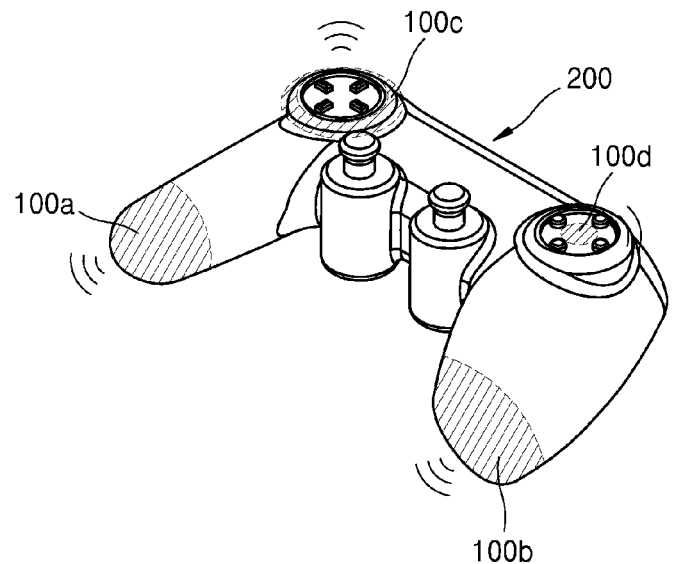
FIGS. 9A-9B illustrate schematic views showing various devices to which a haptic module of the present invention is applied.
Figure 9B:
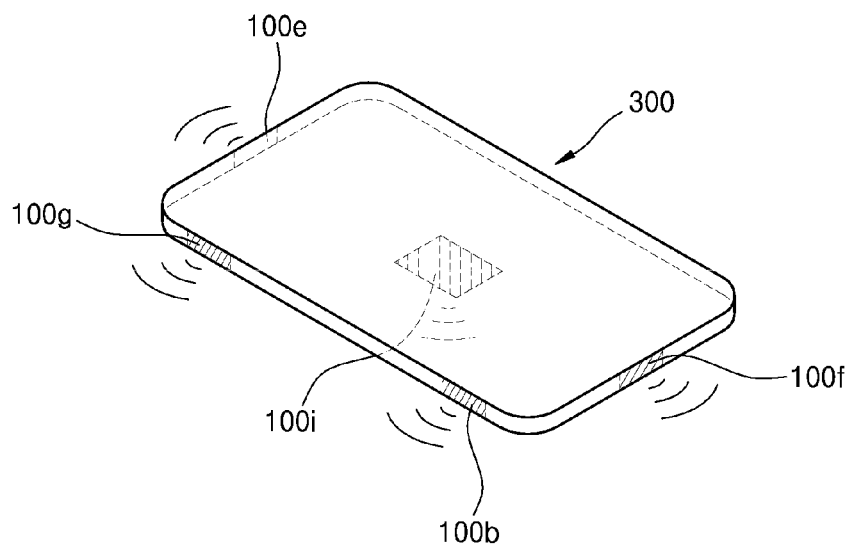

FIGS. 9A-9B illustrate schematic views showing devices 200 and 300 to which the haptic module 100 of the present invention is applied.

Referring to FIGS. 9A-9B, the haptic module 100 may be applied to a surface of a device, such as a game console, a joystick, a mouse, a keyboard, a tablet device, a smartphone, or the like, and may provide haptic sensations in response to various operating conditions. The haptic module may be applied to the surface of any device or instrument that can be in contact with a user.

A plurality haptic modules 100 may be respectively applied to the three-dimensional surfaces of the device 200. The plurality of haptic modules 100 may not only provide haptic sensations for a plurality of regions on one horizontal plane, but may also provide haptic sensations acting in different directions on the three-dimensional surfaces.

FIG. 9A illustrates an example in which haptic modules 100 (100a to 100d) are applied to a game console 200. The haptic modules 100 may be disposed in handle portions 100a and 100b in contact with a user, or around buttons 100c and 100d, to provide haptic sensations.

FIG. 9B illustrates an example in which haptic modules 100 (100e to 100i) are applied to a tablet device 300. The haptic modules 100 may be disposed in portions 100e, 100f, 100g, and 100h where a user grips and holds the tablet device 300, or a wide surface 100i of the tablet device 300, to provide haptic sensations.

Each of the haptic modules 100 (100a to 100i) is disposed in a different direction and may provide a haptic sensation acting in a different direction. Accordingly, the user may be provided with various haptic sensations according to the usage conditions and may be provided with more intense and realistic haptic sensation.

While the present invention has been particularly shown and described with reference to embodiments thereof, it will be understood by one of ordinary skill in the art that various changes in form and details may be made therein without departing from the spirit and scope of the invention as defined by the following claims. The embodiments should be considered in a descriptive sense only and not for purposes of limitation. Therefore, the scope of the invention is defined not by the detailed description of the invention but by the following claims, and all differences within the scope will be construed as being included in the present invention.

The invention claimed is:

1. A haptic module comprising:
a haptic device configured to implement a haptic sensation;
a fixing unit having an insertion hole into which the haptic device is inserted; and
a tactile transmitter connected to the fixing unit and configured to receive the haptic sensation generated by the haptic device, wherein the haptic device comprises a housing;
a magnetic field generator disposed in the housing;
an elastic supporter connected to the housing;
a vibration unit which is connected to the elastic supporter, and which includes an elastic material in which magnetic particles are dispersed in a matrix; and
a controller for transmitting a signal to the magnetic field generator.

2. The haptic module of claim 1, wherein the tactile transmitter is made of at least one of thermoplastic polyurethane (TPU) and thermoplastic elastomer (TPE).

3. The haptic module of claim 2, wherein the fixing unit is made of a material different from that of the tactile transmitter.

4. The haptic module of claim 1, further comprising a cover connected to the tactile transmitter.

5. The haptic module of claim 1, wherein a plurality of insertion holes are formed in the fixing unit, and a plurality of haptic devices are inserted into the plurality of insertion holes, respectively.

6. The haptic module of claim 1, wherein a tactile sensation is provided by a sum of an elastic motion of the elastic supporter and a deformation motion of the vibration unit in response to application of a magnetic field.

7. The haptic module of claim 1, wherein the housing has a shape in which an upper surface is open, and the elastic supporter is connected to an edge of the open upper surface.

8. The haptic module of claim 1, wherein the magnetic field generator comprises a solenoid coil.

9. The haptic module of claim 8, wherein the vibration unit is disposed on an end of the coil of the magnetic field generator.

10. The haptic module of claim 1, wherein the elastic supporter comprises:
an edge portion connected to the housing;
a driver connected to the vibration unit and driven in a vertical direction; and
at least one connecting portion connecting the edge portion with the driver.

11. The haptic module of claim 10, wherein the at least one connecting portion is longer than a rectilinear distance from the edge portion to the driver.

12. The haptic module of claim 11, wherein the at least one connecting portion has a curved shape or a shape having a plurality of curvatures.

13. The haptic module of claim 1, wherein the controller comprises a terminal portion protruding to an outside of the housing and has a flexible printed circuit board (FPCB) formed on the terminal portion, the FPCB being connected to the magnetic field generator.

14. The haptic module of claim 1, wherein the vibration unit is divided into regions each of which has a different polarity.

* * * * *